(12) United States Patent
Tsai

(10) Patent No.: US 6,831,358 B2
(45) Date of Patent: Dec. 14, 2004

(54) HEAT-DISSIPATIVE COATING

(75) Inventor: Aaron Tsai, Taichung (TW)

(73) Assignee: Power Mate Technology Co., Ltd., Taichung (TW)

(*) Notice: Subject to any disclaimer, the term of this patent is extended or adjusted under 35 U.S.C. 154(b) by 0 days.

(21) Appl. No.: 10/429,726

(22) Filed: May 6, 2003

(65) Prior Publication Data

US 2004/0185248 A1 Sep. 23, 2004

(30) Foreign Application Priority Data

Mar. 19, 2003 (TW) ........................... 92204240 U

(51) Int. Cl.[7] .................. H01L 23/34; H01L 23/10
(52) U.S. Cl. ................ 257/717; 257/706; 257/712; 257/713; 257/720

(58) Field of Search .................. 257/706, 712, 257/713, 717, 720

(56) References Cited

U.S. PATENT DOCUMENTS

| | | | | |
|---|---|---|---|---|
| 5,990,550 A | * | 11/1999 | Umezawa | 257/712 |
| 6,174,841 B1 | * | 1/2001 | Yamada et al. | 508/172 |
| 6,432,497 B2 | * | 8/2002 | Bunyan | 428/40.1 |
| 6,635,959 B2 | * | 10/2003 | McCullough | 257/712 |

* cited by examiner

Primary Examiner—Cathy F. Lam
(74) Attorney, Agent, or Firm—Bacon & Thomas

(57) ABSTRACT

A heat-dissipative coating is composed of a plurality of granules having a predetermined thickness and disposed on an object, and is insulated and highly thermal-conductive. The total surface area of the granules is greater than that of the heat-dissipative coating disposed on the object, thereby rendering preferably effective heat-dissipation.

7 Claims, 3 Drawing Sheets

HEAT-DISSIPATIVE COATING

BACKGROUND OF THE INVENTION

1. Field of the Invention

The present invention relates generally to heat-dissipating techniques, and more particularly to a heat-dissipative coating having a rough surface for enlarging a heat-dissipative area of an object and further rendering more effective heat-dissipation for the object.

2. Description of the Related Art

A conventional heat-dissipating technique, applied in a circuit board, lies in either dissipating the heat from a heat-generating electronic element of the circuit board by installing a heat sink or a cooling fan on the heat-generating electronic element, or installing a heat sink on a predetermined position of the circuit board for rendering more effective heat-dissipation.

However, there are drawbacks for the conventional heat-dissipating technique. If the heat sink or the cooling fan is installed, it takes more production cost, more time and procedures for assembly, and dramatically enlarges the size of the whole structure of the circuit board.

SUMMARY OF THE INVENTION

The primary objective of the present invention is to provide a heat-dissipative coating, which enlarges a heat-dissipative area of an object by hardly increasing the height of the object and further enhances effective heat-dissipation for the object.

The secondary objective of the present invention is to provide a heat-dissipative coating, which takes less production cost than that of prior art.

The foregoing objective of the present invention is attained by the heat-dissipative coating, which is composed of a plurality of granules having a predetermined thickness and disposed on an object, and is insulated and highly thermal-conductive. The granules each having a diameter of between 0.05 mm and 0.5 mm. The total surface area of the granules is greater than that of the heat-dissipative coating disposed on the object, thereby rendering preferably effective heat-dissipation.

DETAILED DESCRIPTION OF THE INVENTION

Figure 1:
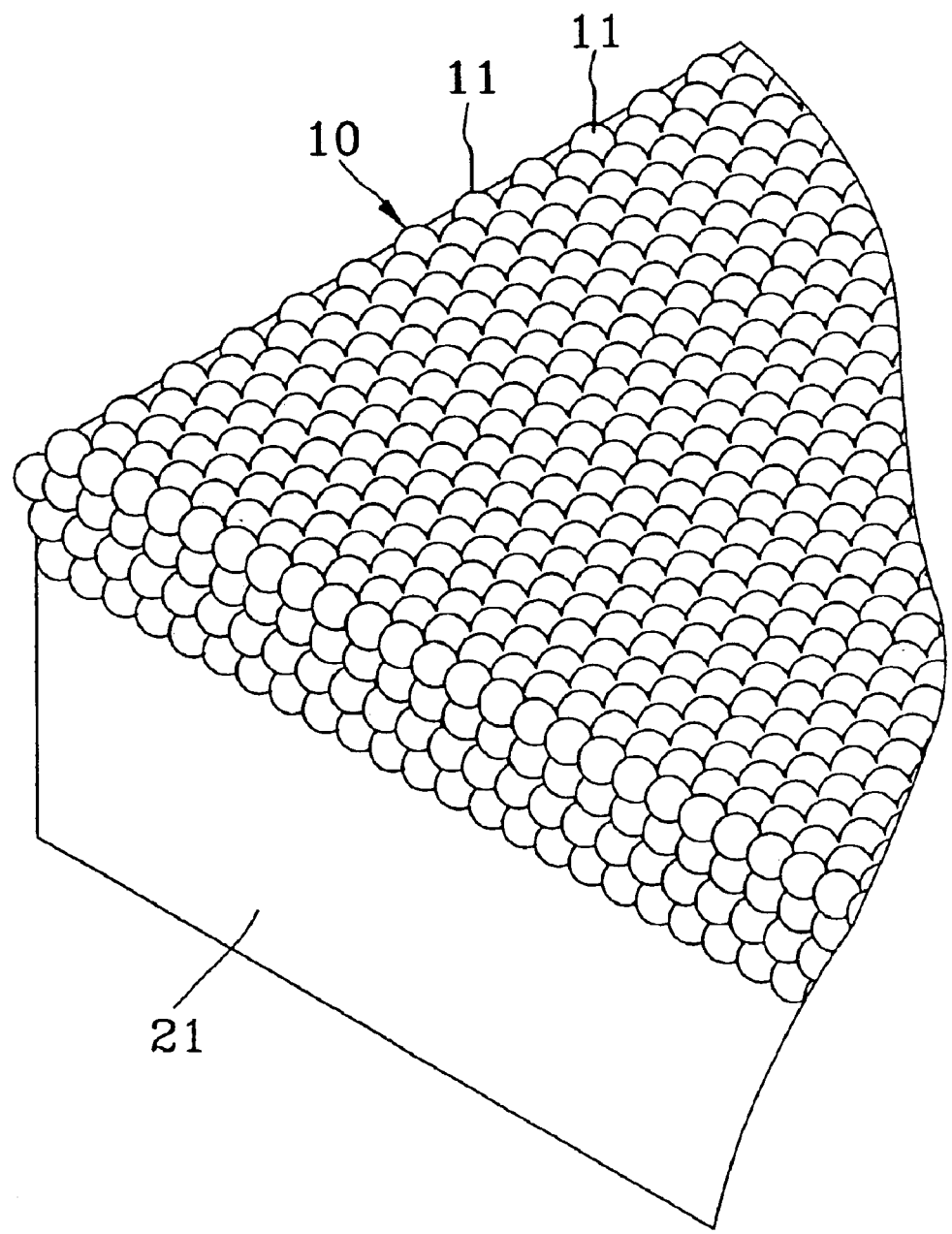
FIG. 1 is a perspective view of a preferred embodiment of the present invention disposed on a circuit board.
Figure 2:
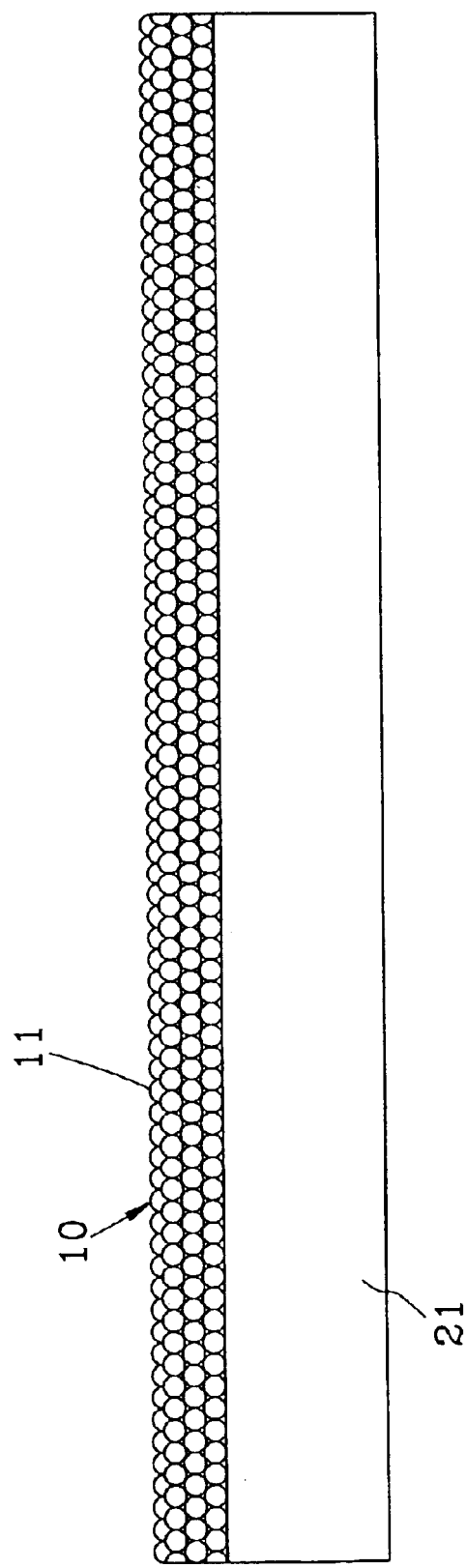
FIG. 2 is a side view of the preferred embodiment of the present invention disposed on a circuit board.

Referring to FIGS. 1–2, a heat-dissipative coating 10 of a preferred embodiment of the present invention is composed of a plurality of granules 11 made of alumina and disposed on atop surface an object, which embodied as a circuit board 21, with a predetermined thickness. Each of the granules 11 has a diameter of 0.15 mm in this embodiment. The heat-dissipative coating 10 is insulated and highly thermal-conductive so as not to cause a shot circuit of the circuit board 21 while disposed on the circuit board 21. Alternatively, the heat-dissipative coating 10 can be made of other oxidative metals, which are likewise insulated and highly thermal-conductive.

The granules 11 each have a spherical surface exposed outside, as shown in FIG. 1, such that the total surface area of spherical surfaces of the granules 11 is at least twice as much as that of the top surface of the circuit board 21. In other words, the heat-dissipative coating 10 disposed on the circuit board has the heat-dissipative area at least twice as much as the total surface area of the top surface of the circuit board 21.

The heat generated by the circuit board 21 is dissipated only via a plurality of metallic wires, like cooper foil, such that the heat-dissipative area of the circuit board 21 is actually less than the half of the total surface area of the top surface of the circuit board 21. Moreover, the heat-dissipative area of the heat-dissipative coating 10 disposed on the circuit board is at least twice as much as the total surface area of the top surface of the circuit board 21. Briefly, the heat-dissipative coating 10 disposed on the circuit board 21 has the heat-dissipative area at least four times as much as that of the circuit board 21. Accordingly, the heat-dissipative coating of the present invention can dramatically enlarge the total heat-dissipative area of the circuit board 21. In addition, the heat-dissipative coating 10 is highly thermal-conductive and insulated, thereby enhancing preferable effective heat-dissipation for the object and keeping the operator secure from electric shock.

It is to be noted that the aforementioned object is not confined to the circuit board but is interchangeable for any other heat-generating device, like motor housing, lighting apparatuses, and so on.

Figure 3:
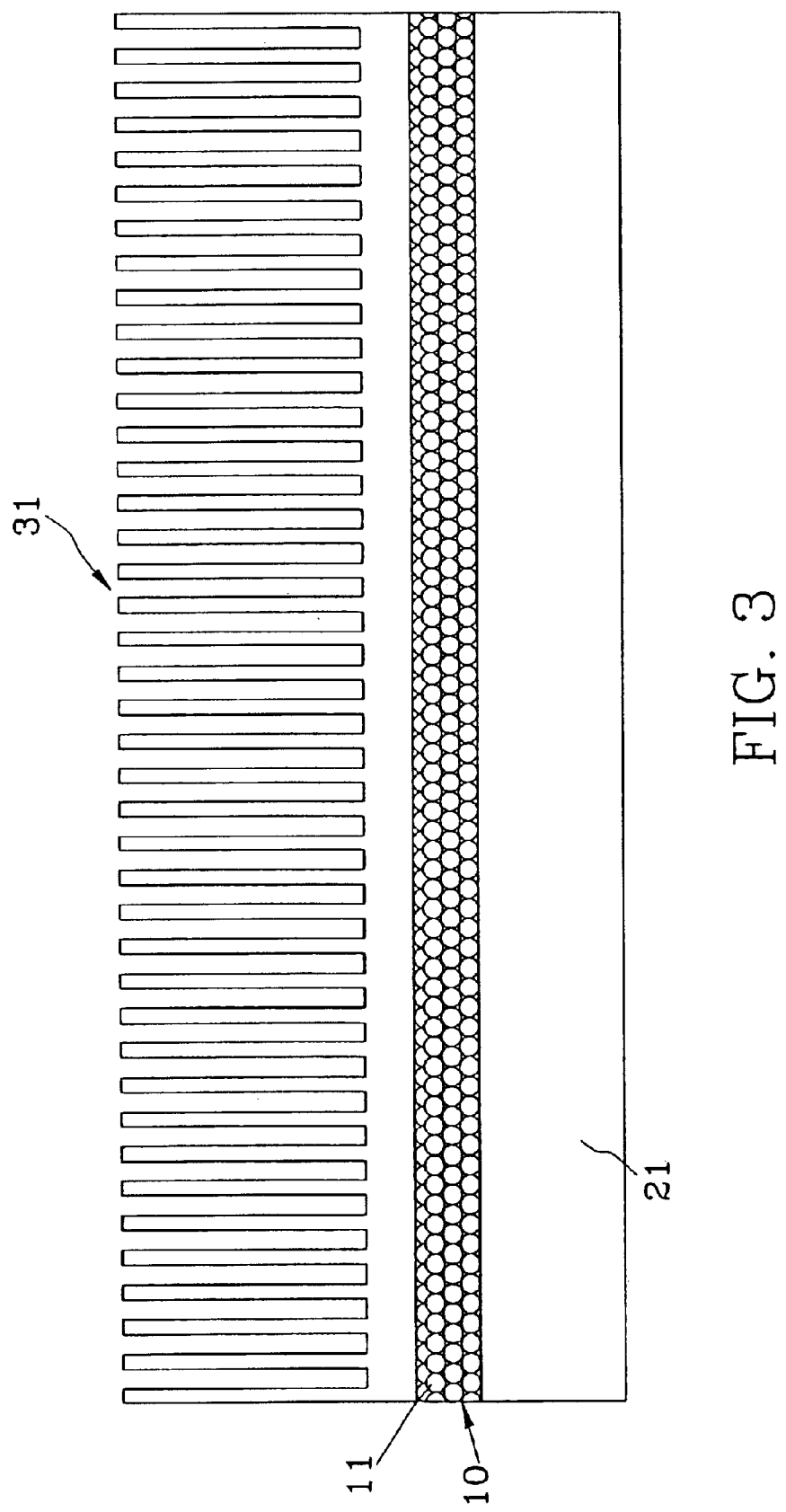
FIG. 3 is a side view of the preferred embodiment of the present invention disposed between a heat sink and the circuit board.

Referring to FIG. 3, a heat sink 31 is adhered to the surface of the heat-dissipative coating 10 that is disposed on the circuit board 21. Accordingly, the circuit board 21 can have more effective heat-dissipation.

In addition to the aforementioned effective heat-dissipation, the heat-dissipative coating of the present invention includes additional advantages as follows:

1. While the present invention is applied, the height of the object will be hardly increased that the object is still flexible to accommodate other devices.
2. Because the present invention can rapidly dissipate the heat out of the object, and then the metal wires of the object will not be affected by the heat to generate high resistance, such that the wires can bear higher current intensity.

What is claimed is:

1. A heat-dissipative coating consisting of a plurality of granules, said granules each having a diameter of between 0.05 mm and 0.5 mm and disposed on an object with a predetermined thickness, said coating is insulated and highly thermal-conductive, total surface area of said granules being greater than that of the object's surface where said heat-dissipative coating is disposed.

2. The coating as defined in claim 1 being made of oxidative metals comprising alumina.

3. The coating as defined in claim 1, wherein said object has a planar surface where said coating is disposed.

4. The coating as defined in claim 3, wherein a heat sink is adhered to said coating at a bottom side thereof.

5. The coating as defined in claim 1, wherein the object is a circuit board, and the granules consisting of spherical alumina having a total surface area at least twice that of the circuit board's surface.

6. The coating as defined in claim 5, wherein the alumina particles have a diameter of 0.15 mm.

7. The coating as defined in claim 5, wherein the total surface area of the spherical alumina granules is at least four times that of the circuit board's surface.

* * * * *